United States Patent [19]
Chalco et al.

[11] Patent Number: 5,948,286
[45] Date of Patent: Sep. 7, 1999

[54] DIFFUSION BONDING OF LEAD INTERCONNECTIONS USING PRECISE LASER-THERMOSONIC ENERGY

[75] Inventors: Pedro A. Chalco, Yorktown Heights; Raymond Robert Horton, Dover Plains; Chandrasekhar Narayan, Hopewell Junction, all of N.Y.; Michael Jon Palmer, Auburn, Ala.

[73] Assignee: International Business Machines Corporation, Armonk, N.Y.

[21] Appl. No.: 08/796,767

[22] Filed: Feb. 6, 1997

[51] Int. Cl.⁶ .................................................. B23K 26/00
[52] U.S. Cl. ................................ 219/121.63; 219/121.64
[58] Field of Search ..................... 219/121.63, 121.64; 228/4.5, 6.2

[56] References Cited

U.S. PATENT DOCUMENTS

| | | | |
|---|---|---|---|
| 4,278,867 | 7/1981 | Tan | 219/121.86 |
| 4,330,699 | 5/1982 | Farrow. | |
| 4,534,811 | 8/1985 | Ainslie | 156/73.1 |
| 4,893,742 | 1/1990 | Bullock | 219/121.64 |
| 4,894,509 | 1/1990 | Chalco et al. | 219/121.64 |
| 4,970,365 | 11/1990 | Chalco | 219/121.63 |
| 5,298,715 | 3/1994 | Chalco et al. | 219/121.64 |
| 5,602,079 | 2/1997 | Takenaka et al. | 219/121.86 |

OTHER PUBLICATIONS

"Discrete Wire Bonding Using Laser Energy" by P. Chalco et al Semiconductor International, May 1988 pp. 130–131.

*Primary Examiner*—Geoffrey S. Evans
*Attorney, Agent, or Firm*—Daniel P. Morris; Alvin J. Riddles

[57] ABSTRACT

Thin film diffusion bonding of lead assemblies under severly limited spacing, thermal and pressure conditions is achieved through application of precisely controlled energy at the bond interface. The precisely controlled energy is a laser thermosonic energy pulse, delivered through a cleaved optical fiber end and closed end tip, that produces a heat increment in excess of the steady state manufacturing design temperature for the assembly and which is applied directly at the bond interface.

3 Claims, 1 Drawing Sheet

DIFFUSION BONDING OF LEAD INTERCONNECTIONS USING PRECISE LASER-THERMOSONIC ENERGY

FIELD OF THE INVENTION

The invention relates to the manufacturing of flat panel displays and in particular to the use of laser-thermosonic energy in the bonding of lead interconnections in those display structures.

BACKGROUND OF THE INVENTION AND RELATION TO THE PRIOR ART

In the technology of flat panel displays the trend in reduction of size is resulting in interconnections that must be made to thin film pads on the display that have low contact resistance and that require a much smaller interconnection area than has been required for the present technology.

Heretofore in the art the technology of flat panel displays employs the technique of surface mounting technology wherein a thermal bonding flex tape forms the interconnecting member between a printed circuit card and the pads on the display. While the attachment of a conductor to the printed circuit card uses a conventional solder reflow method of lead bonding any attachment of a conductor to the ever more finely spaced pads on the substrate of the display requires a much more sensitive bonding technique.

The current state of the art uses an anisotropic conductive polymer as the bonding media instead of the solder material. The pads on the substrate require materials that have oxide films that are difficult to remove by the chemical fluxes used in connection with solder materials. Additionally, the soldering operation requires high temperature excursions and dwell at those temperatures which exposes the delicate structures and materials in a flat panel display assembly to severe damage.

A key technical limitation at this point in the advancement of the art is the presence of higher than tolerable contact resistance which is inherent in the current bonding technology.

A potential solution to the high contact resistance problem would be to employ the technique of diffusion bonding where there is diffusion of atoms from the two surfaces of the materials being bonded across the bonding interface. Ideally the lowest contact resistance would be provided by diffusion bonds under conditions where any thin oxides on the pads are penetrated and intimate contact between the two mating surfaces provides atomic bonding which has very low contact resistance and very high strength. The ability to achieve good diffusion bonds however is affected by some aspects of the pad materials metallurgy that must be used in many flat panel display constructions. The metallurgy is usually aluminum, or molybdenum or a layer structure of Mo/Al/Mo, and it is relatively thin, usually of the order of 1 micrometer. With this metallurgy, for diffusion bonding to take place the tenacious thin oxide films known to form on aluminum or molybdenum surfaces have to be penetrated and the proper level of thermal energy must be present for diffusion to occur at the interface.

The application of the necessary level of thermal energy also must be achieved within certain considerations. Since heat and pressure alone will not penetrate the oxide films, the use of a single point tip heated electrically, or hot thermode elements that press on a row of connections simultaneously, will not be sufficient to form bonds. Ultrasonics have been found to be ineffective because the high levels of vibratory motion needed to provide the energy to clean the bonding surfaces sufficiently to promote diffusion causes structural damage. Further, in displays in which there is a glass substrate, the material is brittle and subject to cracking under bonding stresses and thermal or mechanical shock.

The use of concentrated short duration combined thermal and vibration energy such as would be provided by combining a laser with an ultrasonic source in a single tool would appear to be a promising technology for the control needed to perform the bonding under the size, vibration and thermal sensitivity limitations.

The use of the combination of laser and ultrasonic energy has been developing in the art. U.S. Pat. Nos. 4,330,699 and 4,534,811 are examples. As the requirements of the art have become more stringent, a tool employing the use of a shutter between a continuous wave laser and an optical fiber that was terminated in a tip designed to hold a wire in wire bonding, was developed by Chalco et al. The development is described in an article entitled "Discrete Wire Bonding Using Laser Energy" in Semiconductor International, May 1988, Pages 130–131. Further developments in the art involved tighter limitations on bonding pressure and temperature control where the substrate can move and there are substrate melting limitations. These limitations are discussed in U.S. Pat. No. 4,970,365 wherein in a tool employing a synchronized ultrasonic pulsed continuous wave laser with an optical fiber delivers shaped focused energy through a center hole in a slotted bonding tip.

Further control of any energy in excess of the minimum necessary to overcome the oxides and produce diffusion at the contact interface is needed in order to meet all the limitations being imposed by the use of brittle substrates and ever more complex metallurgy.

SUMMARY OF THE INVENTION

The invention achieves thin film bonding of leads to substrates under severly limited spacing, thermal and pressure conditions through precisely controlled heat, pressure and bond area using substrate steady state heating, precise laser thermosonic pulse heat increments over the steady state heat delivered with minimal loss through a cleaved end of an optical fiber and closed end tip to a precise area contact.

DESCRIPTION OF THE INVENTION

Figure 1:
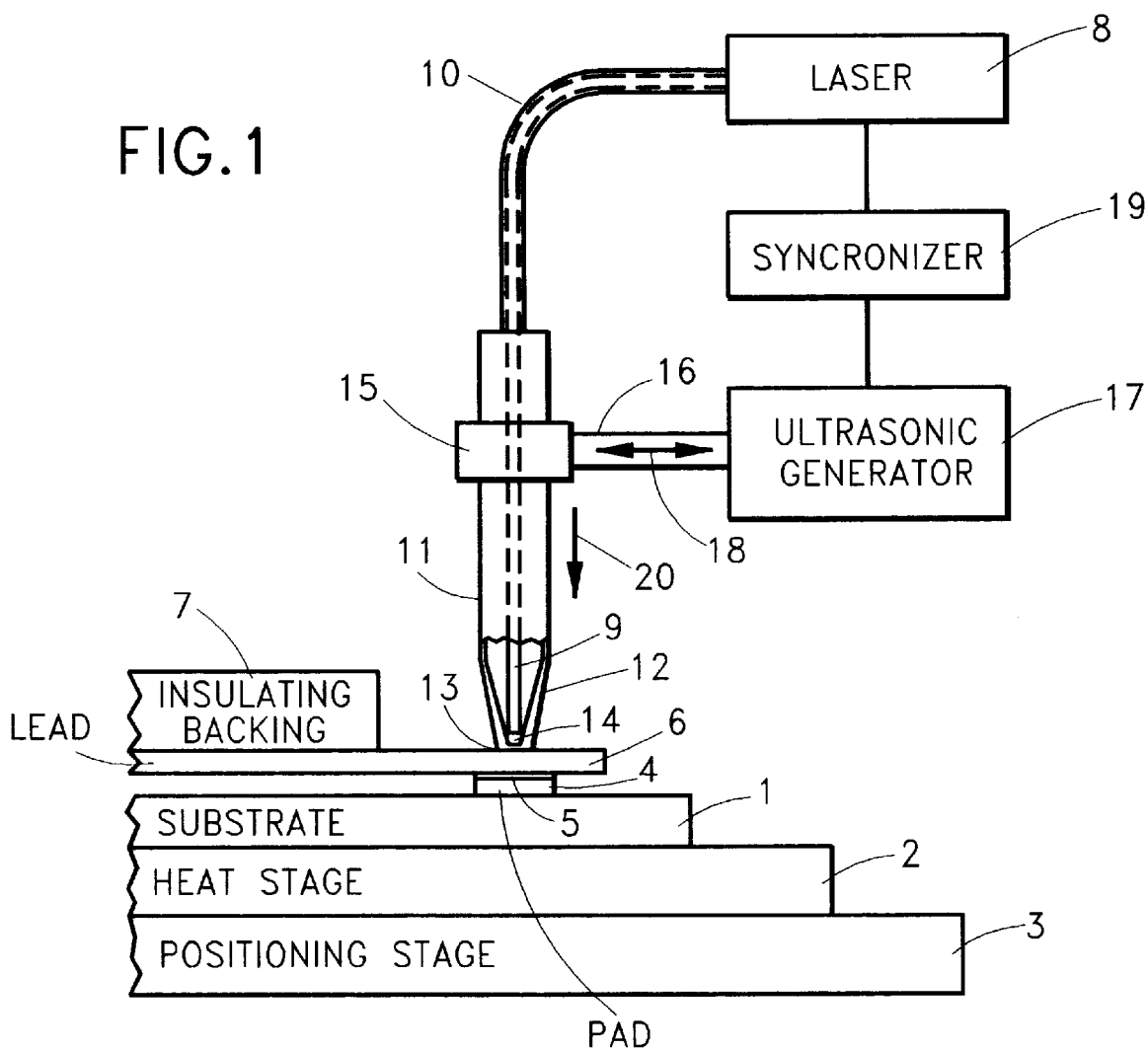
FIG. 1 is a schematic diagram of the apparatus in practicing the invention.

Referring to FIG. 1 there is shown a schematic diagram of the apparatus in practicing the invention. A substrate 1 of an inert material such as glass is positioned on a temperature controlled heat stage 2 which further in turn is positioned on a positioning stage 3 such as an X-Y-Z-Theta stage used in the art. The substrate 1, has a relatively thin metal pad 4, which is of the order of 1 to 10 micrometers thick. There is a relatively tenacious native oxide coating 5 resulting from air exposure of the metal pad 4. A gold plated copper lead 6, with a standard insulating supporting portion 7, such as a part of an end of a flex tape or a printed circuit board standard in the art, is positioned, with the portion of the lead 6 to be bonded, in contact with the pad 4 and oxide 5.

The heat energy used in the bonding comes from two sources, a first source is the stage 2 which supplies a steady state temperature level that is close to the specification upper temperature level for parts such as a flex tape. The heat energy increment above the level supplied by the stage 2, to be used in the bonding of the pad 4 and lead 6 in the presence of the oxide 5, is supplied by a laser 8 as a second heat source that is delivered through an optical fiber 9 encased in a sheath 10, with the optical fiber extending into a capillary hole in a tip 11 that has a tapered portion 12 with a closed end 13. The tip 11 may be of a heat tolerant material or metal such as tungsten, or intermetallics such as tungsten carbide or titanium carbide. The optical fiber 9 has a diameter in the range of 100 to 200 micrometers and is made of a glass material such as silica. The end of the optical fiber 9 is at a separation of within about 10 mils of the closed end 13 of the tip 11 and is cleaved for enhanced energy delivery, as is further described in connection with FIG. 2.

The laser can be any high power laser such as a YAG or Ar-ion standard in the art, operating in the contunuous wave (CW) mode and capable of delivering in the range of 10–20 watts of average power.

The tip 11 is attached via a collar 15 that is part of an ultrasonic horn type link 16 to a source of ultrasonic energy 17 that provides ultrasonic reciprocating motion as depicted by the double headed arrow 18 to assist in breaking up the oxide 5 during the bonding operation.

An electronic synchronizing interfacer 19 standard in the art syncronizes the ultrasonic motion pulses with the laser energy pulses at the tip 11 during the bonding operation.

The ultrasonic energy is of the order of 10 milliwatts to 100 milliwatts.

The duration of the laser energy pulse is from 50 milliseconds to 300 milliseconds.

In the bonding operation the tip 11 is positioned with the closed end 13 in contact with the lead 6 under a light pressure force in the range of about 50 to 200 grams. The force is depicted by the arrow 20.

Figure 2:
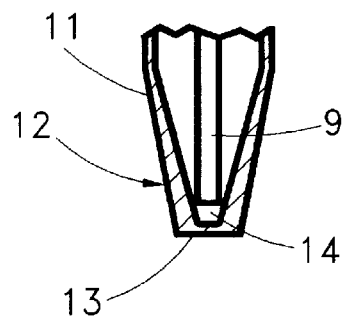
FIG. 2 is a view of a portion of the tip member illustrating the cleaved fiber optic energy coupling.

Referring to FIG. 2 a view is provided of the closed end portion 12 of the tip member 11 illustrating the laser energy coupling achieved through the cleaving of the end of the optical fiber 9 and positioning the optical fiber 9 end in contact with the closed end 13 of the tip 11 at a separation 14 of from 2 to 10 mils from the end of the tapered portion 12 of the tip 11. The coupling achieved permits more precise relationship of the energy supplied with the amount needed to achieve the desired bond under the size and temperature limitations. The cleaved end of the optical fiber 9 interface at the closed end 13 has minimum energy loss at the interface.

The cleaving of the terminating end contacting is achieved by applying a force to a sharp edge cleaving instrument such as a diamond blade to the polished end of the optical fiber 9 in a plane perpendicular to the center line of the optical fiber so as to provide a clean terminating surface of the optical fiber 9.

In operation, referring to FIGS. 1 and 2, a substrate such as a flat panel display made up of at least element 1, with at least one oxide 5 covered contact pad 4, is positioned on the heater 2, and maintained at a steady state temperature which is usually the highest manufacturing steady state temperature specification for the display member. This prevents any of the heat that must be applied in bonding from being dissipated into the substrate structure. The heater 2 temperature is usually from about 100 to 150 degrees C.

An insulation supported lead assembly made up of at least lead element 6 supported by insulation element 7 is positioned with the lead 6 in alignment with the oxide 5 covered pad 4 with the substrate 1, heat stage 2 and lead assembly 6 & 7 brought into proximity with the end 13 of the tip 11 by the X–Y–Z capability of the positioning stage 3.

The tip 11 is then moved into contact with the side of the lead 6 opposite to the contacting side for applying controlled pressure, as depicted with arrow 20, through the lead 6, the oxide 5 and the pad 4, while, the ultrasonic generator 17 through the horn made up of the collar 15 and coupler 16, the synchronizer 19 and the laser 8 together, deliver through the cleaved optical fiber 9 end and the closed tip 11 end 13, a localized measured energy increment that raises the temperature in excess of the steady state heat established by the heat stage 2 only in the interface of the pad 4 and lead 6 and only for enough to achieve the desired bond. The energy increment occurs in the presence of ultrasonic vibration that breaks up the oxide 5 and the combination of the synchronized vibration under pressure and laser energy pulse provides just enough energy to cause an atomic diffusion bond to take place across the pad 4 lead 6 interface. The flat closed end 13 and cleaved end of the optical fiber 9 in combination reduce energy coupling losses that in turn permits more precise energy pulses to be used and limits excess energy over just enough to produce the desired bond. Typically the force applied by the tip 11 is about 50 to 200 grams, the ultrasonic energy is of the order of 10 milliwatts to 100 milliwatts and the duration of the pulse is from 50 milliseconds to 300 milliseconds.

It will be apparent to one skilled in the art that while the description has been focused on the single contacting operations and on flat panel displays for explanation simplicity and clarity the principles of the precise minimum energy transfer concept of the invention there will be many variations of the principle and apparatus to which it may be applied.

What has been described is a principle for achieving thin film diffusion bonding of leads to substrates under severly limited spacing, thermal and pressure conditions through application of a precisely controlled heat increment in excess of the steady state manufacturing design temperature being applied directly at the bond interface.

What is claimed is:

1. In the formation of a diffusion bond contact between a conductive lead, on an insulating supporting member having an upper temperature level specification, superimposed on a thin, tenacious native oxide forming, pad, positioned on a substrate, the improvement comprising:

the maintaining of the temperature of said substrate in the vicinity of said upper temperature level specification for said insulating supporting member, while applying an ultrasonic motion synchronized with increments of laser heat, across the interface of said conductive lead and said pad, said ultrasonic motion and said increments of laser heat being delivered to said interface through a solid face tip applied with pressure to said conductive member urging said conductive member and said pad positioned on a substrate together, and, said laser heat being supplied to said tip through an optical fiber with an end positioned in said tip with a cleaved end proximate but separated from said solid face of said tip.

2. Apparatus for producing a diffusion bond between at least one conductive lead mounted on an insulating backing having an upper temperature specification, and a corresponding pad on a substrate, comprising in combination:

support means for supporting a substrate having at least one said pad on an exposed surface thereof, in an alignable heated condition at a temperature in the vicinity of said upper temperature specification of said insulating backing, force and bonding means including at least one bond forming tip,
    said force means applying pressure that urges each said lead into contact with said corresponding pad,
    said bonding means including,
    laser energy source means coupled into each said tip through an optical fiber,
    ultrasonic motion means connected to said tip and adapted for producing ultrasonic motion parallel to said exposed surface, synchronizing means operable to coordinate said laser energy and said ultrasonic motion into an energy pulse, and, energy pulse transfer means comprising the combination of a closed end on said tip and a cleaved end on said optical fiber.

3. The method of the diffusion bonding of a conductive lead to a pad location on a substrate of an electronic apparatus, comprising the steps of:

maintaining said substrate at a steady temperature state that is near the allowed maximum, positioning an ultrasonically vibrating tip with a flat face at said lead to pad location, and, applying through said tip, in precisely controlled increments, synchronized laser heat and motion energy, delivered through an optical fiber with a cleaved end positioned in said tip.

\* \* \* \* \*